United States Patent [19]

Ruppel et al.

[11] 4,348,611

[45] Sep. 7, 1982

[54] FERROELECTRIC OR PYROELECTRIC SENSOR UTILIZING A SODIUM NITRITE LAYER

[76] Inventors: Wolfgang Ruppel, Stolper Strasse 6a; Ullrich Hetzler, Machstrasse 11; Horst Vogt, Roonstrasse 17; Peter Wurfel, Schneidemuhler Str. 24b, all of 7500 Karlsruhe, Fed. Rep. of Germany

[21] Appl. No.: 213,649

[22] Filed: Dec. 5, 1980

Related U.S. Application Data

[63] Continuation-in-part of Ser. No. 882,796, Mar. 2, 1978, Pat. No. 4,259,365.

[51] Int. Cl.³ .................. H01J 31/00; H01J 31/26; G01J 1/48
[52] U.S. Cl. .................... 313/388; 29/571; 29/572; 29/573; 250/211 R; 250/338; 250/356.1; 357/29; 357/30; 358/113; 358/209; 358/213; 358/217; 361/282; 365/65; 365/117; 365/145; 428/910; 428/913
[58] Field of Search .............. 358/113, 209, 213, 217; 350/338; 29/571, 572, 573; 365/65, 117, 145; 428/910, 913; 427/64, 72, 93, 100; 136/254; 250/211 R, 338, 340, 356; 361/282; 357/29, 30; 313/388

[56] References Cited

U.S. PATENT DOCUMENTS 4,047,214  9/1977  Francombe et al. ............... 357/23

FOREIGN PATENT DOCUMENTS 2609292  9/1977  Fed. Rep. of Germany .
2609292  3/1980  Fed. Rep. of Germany .

OTHER PUBLICATIONS

"Applied Optics", vol. 12, No. 11, Nov. 1973, p. 2532, Chopper Stabilized Null Radiometer, etc., by Jon Geist and W. R. Blevin.
Electrically Calibrated Pyroelectric Optical-Radiation Detector, "Applied Optics", vol. 12, No. 10, Oct. 1973, p. 2494, by Robert J. Phelan, Jr. and A. R. Cook.

Primary Examiner—Michael R. Lusignan
Assistant Examiner—Thurman K. Page
Attorney, Agent, or Firm—Marianne Rich

[57] ABSTRACT

A pyroelectric or ferroelectric sensing element consists of a substrate with a thin layer of sodium nitrite. Electrodes may be applied to both sides of the sodium nitrite layer, or, alternatively, only one electrode may be used. In one embodiment, an array of electrodes is applied to one side of a continuous sodium nitrite layer, while the other side has a continuous electrode. In another embodiment, the sodium nitrite layer consists of separate portions, each interposed between one electrode of an electrode array and either the substrate or a second, continuous electrode.

19 Claims, 11 Drawing Figures

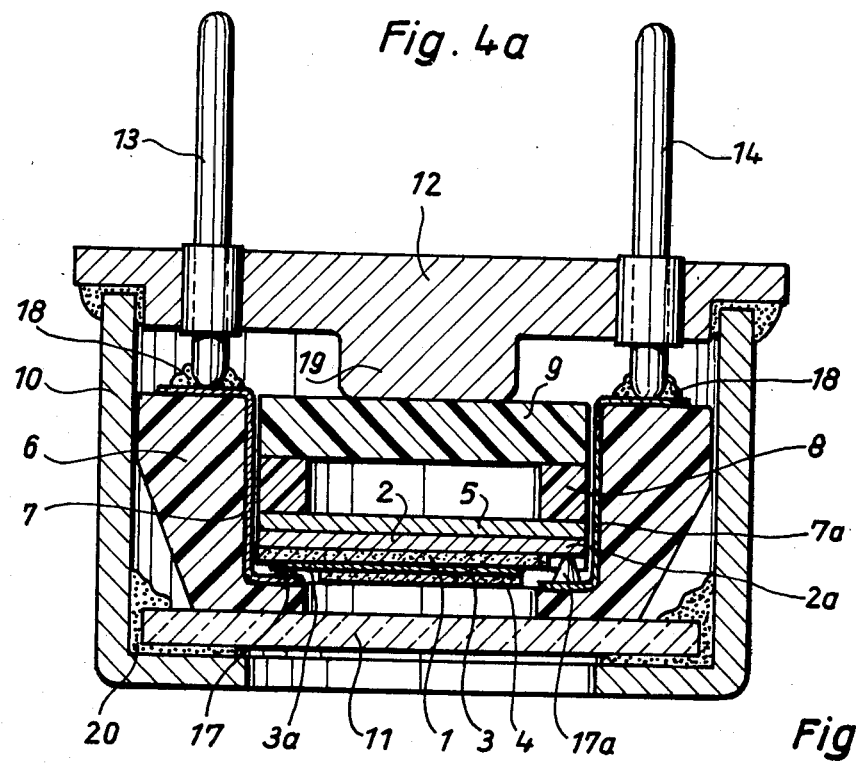
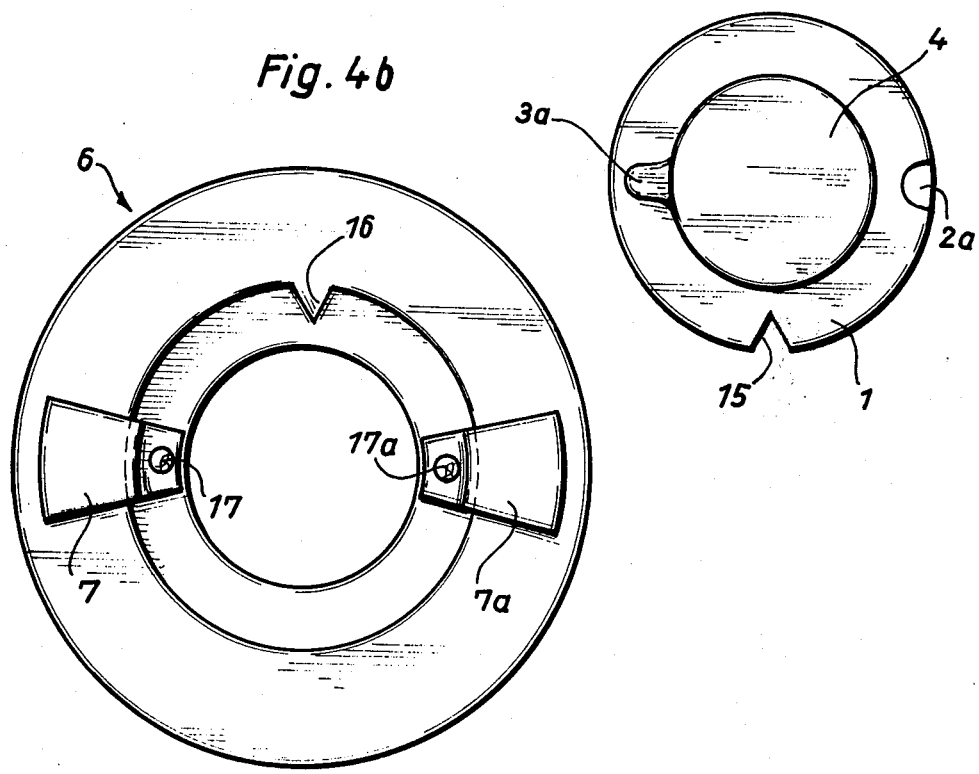

FERROELECTRIC OR PYROELECTRIC SENSOR UTILIZING A SODIUM NITRITE LAYER

CROSS REFERENCE TO RELATED APPLICATIONS AND PUBLICATIONS

The present application is a Continuation-in-Part of our co-pending application, Ser. No. 882,796 filed Mar. 2, 1978 for "METHOD FOR CREATING A FERROELECTRIC BODY AND A SENSING ELEMENT CREATED BY SAID METHOD" which has been patented as U.S. Pat. No. 4,259,365 and which is hereby incorporated by reference into the present application.

The present invention relates to pyroelectric or ferroelectric sensors and circuits utilizing same.

BACKGROUND AND PRIOR ART

The French patent publication No. 2,130,629 discloses a method wherein triglycine sulfate is utilized as a ferroelectric or pyroelectric material. The triglycine sulfate, in the form of a fine suspension in a liquid in which it is not soluble, is deposited on the top surface of the substrate by a simultaneous application of an electric field.

Further, measurements made on large sodium nitrite crystals (F. Jona, G. Shirane, Ferroelectric Crystals, Pergamon Press 1962), indicate that sodium nitrite is a ferroelectric material. However, sodium nitrite has, up to now, not been taken into consideration for the manufacture of solid ferroelectric or pyroelectric building blocks, because no advantages relative to the known ferroelectric materials such as barium titanate and triglycine sulfate were recognized.

SUMMARY OF THE INVENTION

It is an object of the present invention to furnish ferroelectric or pyroelectric sensors which are simple and economical to manufacture and have good ferroelectric and pyroelectric characteristics. It is a further object of the present invention to disclose the apparatus utilizing such sensors.

Briefly, the present invention comprises a sensing element for detecting energy changes, such as, for example, radiation changes of various types, changes in electrical energy applied to the sensing element, etc. The sensing element comprises a substrate and a thin crystalline layer of sodium nitrite deposited on the substrate, as well as at least one electrode making contact to the sodium nitrite layer. The sensor can be used, for example, as a pyroelectric radiation detector, as a target in a television camera or as an MIS-field effect transistor.

The present invention, both as to its construction and its method of operation, together with additional objects and advantages thereof, will best be understood from the following description of preferred embodiments when read in connection with the accompanying drawing.

BRIEF DESCRIPTION OF THE DRAWINGS

FIGS. 4a, b, c show a preferred embodiment of an infrared detector in accordance with the present invention;

DESCRIPTION OF THE PREFERRED EMBODIMENT

Figure 1:
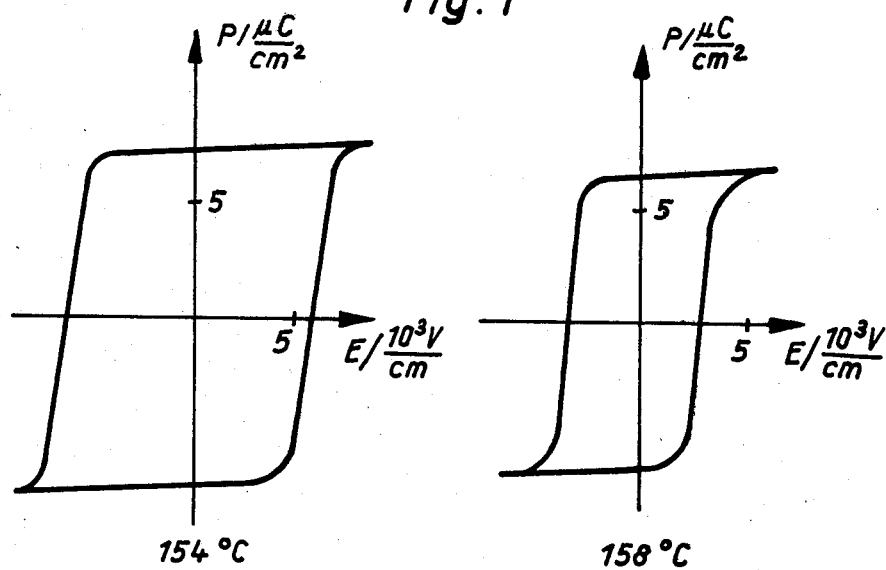
FIG. 1 is a plot of the dielectric polarization of a sodium nitrite film as a function of electric field for two different temperatures.

Several methods of forming a sodium nitrite layer on a substrate will first be discussed. In the first, 300 grams of analytic grade sodium nitrite were melted in a 200 ml beaker. The beaker was covered with a heating coil on its bottom and sides so that the sodium nitrite melt would be maintained at the most uniform temperature possible. The heating power was regulated by a temperature regulator in such a way that the temperature of the melt varied by less than 0.1 degrees centigrade. The melt was kept above the melting point for one day prior to the manufacture of the first sodium nitrite layer.

Mica, having an $SnO_2$ layer as electrode on one of its sides, was utilized as substrate. In order to apply the electrode to the mica substrate, the substrate was heated to approximately 400 degrees centigrade and sprayed with a mixture of $SnCL_4$, methanol, $H_2O$ and HCl. This causes a layer of a thickness of less than one $\mu m$ of chlorine doped tindioxide (herein after called a tindioxide layer) to be formed. The mica substrate with the tindioxide layer was clamped in a holder and dipped into the sodium nitrite. It remained in the sodium nitrite for several hours, whereby the top surface of the tindioxide layer was cleaned. Thereafter the holder with the substrate was pulled out of the sodium nitrite melt with a speed of approximately 1 mm/sec by means of a synchronous motor with suitable gearing. The film that clung to the substrate was only several $\mu m$ thick. This film crystallized at a distance of several millimeters over the top surface of the sodium nitrite melt. The temperature at the surface of the melt was kept about 5 degrees centigrade above the solidification point of the melt. It was found that the thickness of the sodium nitrite film crystallized on the substrate and the uniformity of the crystal structure depend critically on the temperature of the melt, and particularly on the temperature at the top surface of the melt, as well as on the speed with which the substrate is withdrawn from the melt. Increasing the temperature of the melt causes thinner but less uniform layers to form. An increase in the withdrawal speed also leads to less uniformly crystallized layers.

For ferroelectric building blocks, layers of a thickness of approximately 1 to 25 $\mu m$ have been found usable in recent experiments. The optimum layer thickness is approximately 1–10 $\mu m$.

In a second method, the mica substrate with the tindioxide layer was of a shape symmetrical to an axis of rotation and was mounted in a rotatable holder. Specifically, a vacuum pump was used to suck the substrate through a bore in the axis of the holder against a perforated plate. Hot air was then blown against the substrate to raise its temperature to a temperature only slightly below the melting point of sodium nitrite. The blowing of hot air took place in rings, so that the temperature was lowest at the center of rotation of the substrate. A drop of molten sodium nitrite at a temperature of approximately 5 degrees centigrade above the melting point was then dropped onto the center of the rotating substrate. At 50 to 100 rotations per second, a drop of sodium nitrite was hurled outwards in such a way that a uniform sodium nitrite film of approximately 1 $\mu$m thickness was formed. Since the temperature was the lowest at the center of rotation, the crystallization started at the center and then proceeded outward.

In a third embodiment of the method of the present invention, a solution of sodium nitrite was substituted for the molten sodium nitrite mentioned above. $H_2O$ constitutes a good solvent. To produce a sodium nitrite solution, 120 g sodium nitrite was stirred into 100 cubic centimeters $H_2O$ at a temperature of 50 degrees centigrade. A saturated sodium nitrite solution resulted, as well as some bottom sediments of sodium nitrite. Uniform thin films could be obtained either by dipping the substrate into the 50 degrees centigrade solution and then withdrawing it from the solution, or by putting a drop of the 50 degrees centigrade solution onto a rotating substrate warmed to 40 degrees centigrade. In both cases the speed of crystallization could be controlled within certain limits by the temperature and the humidity of the surrounding air.

Figure 3:
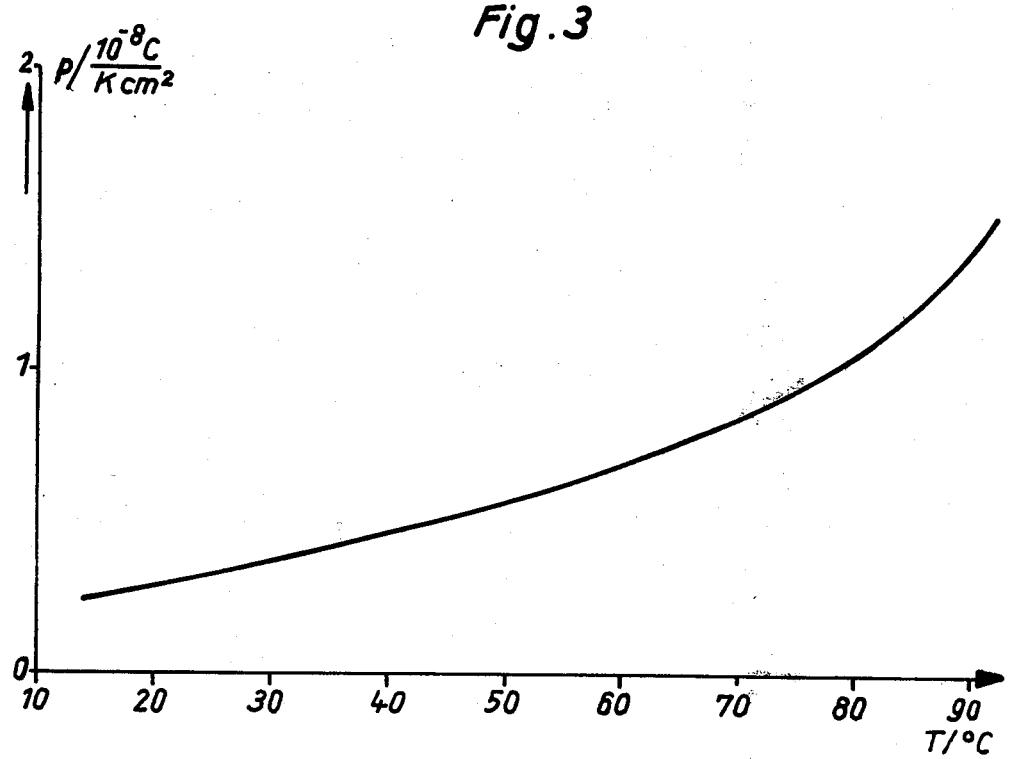
FIG. 3 is a plot of pyroelectric coefficient as a function of temperature for the sodium nitrite element of the present invention.
Figure 2:
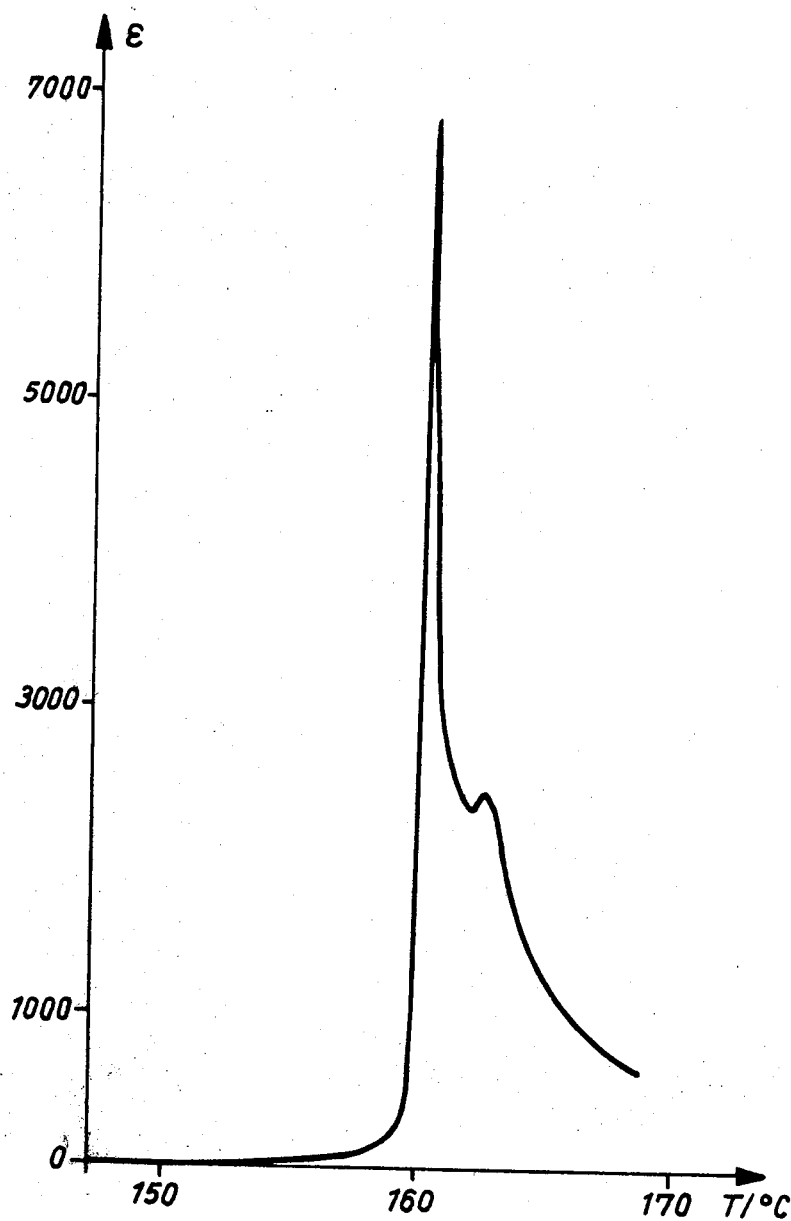
FIG. 2 is a plot of the dielectric constant as a function of temperature for a sodium nitrite body of the present invention.

The results of measurements conducted on a ferroelectric building block or sensing element as manufactured by the method described in example 1 above are shown in FIGS. 1 to 3.

FIG. 1 shows the variation of the dielectric polarization P of the sodium nitrite layer as a function of electric field strength E. The characteristic hysteresis curve for ferroelectric material results. The spontaneous polarization P for a field strength E=0 is approximately 7$\mu$ coulombs per square centimeter at a temperature T=154 degrees centigrade and 6$\mu$ coulombs per square centimeter for a temperature T=158 degrees centigrade. The spontaneous polarization thus decreases with increasing temperatures. At the Curie temperature, $T_c$, it disappears entirely. This temperature is slightly above 160 degrees centigrade for sodium nitrite crystals. The appearance of a spontaneous polarization below the temperature $T_c$ is typical for ferroelectric material.

The dielectric constant $\epsilon$ of ferroelectric material is known to show a sharp rise in the vicinity of the Curie temperature $T_c$. In FIG. 2, the dielectric constant of the sodium nitrite building block is plotted as a function of temperature. It is to be noted that it has a sharp maximum at approximately 160 degrees centigrade, the Curie temperature of sodium nitrite.

The change in spontaneous polarization P as a function of temperature T is called the pyroelectric coefficient p. FIG. 3 shows the variation of p of the sodium nitrite layer of the solid body manufactured in accordance with the present invention as a function of temperature. p is a measure for the charge which flows through an external circuit in response to a change of temperature of the layer, such as might be caused by incident radiation. The charge can thus be used to indicate such a temperature change and therefore the presence of such incident radiation.

The figure of merit of a pyroelectric material is given by $p/c\rho\epsilon$ (E. H. Putley in "Semiconductors and Semimetals", edited by R. K. Willardson & A. C. Beer, 1970, Vol. 5, p. 266). Here c is the specific heat, $\rho$ the mass density, and $\epsilon$ the dielectric constant. For the sodium nitrite layer of the solid body or sensing element according to the present invention, a figure of merit of $2.4 \times 10^{-12}$ m/V was found. As a comparison, the figure of merit for monocrystalline triglycine sulfate is $2.6 \times 10^{-12}$ m/V and for lanthan-doped lead-zirconate-titanate-ceramic (PLZT) less than $10^{-13}$ m/V (R. G. F. Taylor and H. A. H. Boot, Contemporary Physics, Vol. 14, 1973, p. 73).

Although the pyroelectric coefficient p of sodium nitrite is small relative to that of triglycine sulfate, the figure of merit in both cases is approximately the same. This is due to the small dielectric constant $\epsilon$ of sodium nitrite. The figure of merit determines the voltage responsivity of a pyroelectric detector. In order to match the detector to an amplifier, the capacitance of the detector may not be less than that of the amplifier. Because of the small dielectric constant of sodium nitrite, such a relatively high capacitance can only be achieved by small layer thicknesses. It has been demonstrated experimentally that layer thicknesses of approximately 1–25 $\mu$m result in a sufficient electrical capacity. The optimum layer thickness is approximately 1–10 $\mu$m.

The thickness of the layer also has a large effect in determining the current responsivity. The latter is independent of the dielectric constant, but increases with decreasing thermal capacity of the detector. The thinner the layer, the smaller the thermal capacity.

The detectivity D* (E. H. Putley, loc. cit. p. 270), of pyroelectric radiation receivers lies in the region of $10^7$ to $10^9$ cm Hz $^{\frac{1}{2}}$w$^{-1}$ (D. H. Putley in "Optical and Infrared Detectors", edited by R. J. Keyes, Springer-Verlag, Berlin-Heidelberg-New York, 1977, p. 81). With a radiation detector utilizing a sensing element with a sodium nitrite layer as manufactured in the first embodiment above, a value of D*= $10^9$ cm Hz $^{\frac{1}{2}}$w$^{-1}$ was measured at a bandwidth of 10 Hz.

As the above described measurements show, the substrates covered with the crystalline sodium nitrite layers constituting the sensors of the present invention have good ferroelectric and pyroelectric characteristics. It is thus to be assumed that a certain amount of alignment of the sodium nitrite crystals within the layer occurs. In order that the characteristics may be quantitatively reproducible in different samples, either the initial conditions must be maintained the same or additional measures must be taken to effect the crystal orientation in the sodium nitrite layer. Several such methods will now be discussed.

In the first, a substrate with a tindioxide layer was produced in the shape of a wedge. A piece of sodium nitrite crystal approximately 1 mm×1 mm×1 mm in size was fastened to the tip of the wedge as seed crystal. It was so positioned that its crystallographic b-axis (ferroelectric axis which lies in the [010] direction) was perpendicular to the substrate. With the tip of the wedge at the top, the substrate was dipped into the sodium nitrite solution or melt. It was immersed to a depth such that the seed crystal was just wetted by the sodium nitrite and began to dissolve at its bottom surface. At that point, the substrate was pulled out of the melt or solution with a speed of approximately 1 mm/sec. Upon crystallization, an orientation determined by the seed crystal resulted.

A second method for influencing the orientation of the sodium nitrite crystals is as follows. A substrate with a tindioxide layer was pulled out of a sodium nitrite melt with a speed of 1 mm/sec. It was pulled past an electrically conductive surface which was close to the sodium nitrite melt but did not touch it. An electrically insulating spacing holder was used to maintain a distance of 0.2 mm to the substrate. A potential difference of 1,000 volts DC was maintained between the conductive surface and the tindioxide layer on the substrate. An electric field perpendicular to the substrate was thus created. The $NO_2$ groups of the sodium nitrite film on the substrate which were still mobile when entering the field were aligned by the electric field in such a way that upon crystallization their dipole moment was aligned parallel to the electric field, that is perpendicular to the substrate. Thus the spontaneous polarization of the sodium nitrite, which is determined by the dipole moment of the $NO_2$ groups, was also fixed in the direction perpendicular to the substrate.

Non-uniformly crystallized sodium nitrite layers were similarly oriented, by first placing them horizontally at a distance of 0.2 mm under an electrically conductive plate where they were heated above the melting point. They were then slowly cooled in the electric field, causing the correct orientation of the spontaneous polarization.

An orientation of the b-axis of the sodium nitrite layer perpendicular to the substrate was achieved by a microscopically fine grooving of the top surface of the substrate. A substrate comprising mica with a layer of tindioxide was grooved by wiping along straight lines or rubbing with a paper handkerchief. The sodium nitrite layer applied either from a melt or from a solution of sodium nitrite was then oriented as stated above.

Recrystallization of sodium nitrite layers deposited on a substrate either from a solution or from a melt was achieved by moving the layer at a distance of 0.2 mm under an electrically heated platinum wire, the temperature of the wire being between 500 and 600 degrees centigrade. This caused the layer to be melted in a narrow zone under the wire and to solidify behind the wire. The process was repeated until a uniform crystal orientation was achieved.

A determining factor for the spontaneous polarization of the ferroelectric building block is not the direction of the b-axis relative to the substrate, but the direction of the polarization vector. The polarization vector and the b-axis are always parallel to each other, the former pointing either in the same or in the opposite direction as the latter. Even in a monocrystalline layer in which the b-axis can be in one direction only, the polarization in different ferroelectric domains may be in opposite directions, so that the average polarization of a layer which can be externally determined may be very small. In an electric field of the order of magnitude of $10^3$ to $10^5$ V/cm and at temperatures between 80° and 160° C., the polarization in the individual ferroelectric domains of the sodium nitrite layer can be uniformly oriented. This can be done even when the b-axis is not parallel to the electric field. However, in the latter case, the resultant polarization is only the value of the projection of the polarization in the direction of the electric field. For a polycrystalline layer in which the b-axis of the individual crystals is randomly oriented, the resultant value of polarization will be half the maximum value, that is, half the value which would be obtained if the b-axis and thus the polarization were perpendicular to the substrate. It is thus seen that even polycrystalline layers are suitable for use in ferroelectric building blocks.

A radiation detector in accordance with the present invention is shown in FIGS. 4a–4c. FIG. 4a shows a vertical section through the detector, while FIGS. 4b and 4c are top views, respectively, of a plastic ring and of the substrate disc with its layers.

The sodium nitrite film 1 deposited from a solution or melt onto a mica substrate 5 with tindioxide electrode 2 has gold vapor-deposited thereon through a mask in a high vacuum. The so manufactured gold contacts 3 were circular, had a diameter of 3 mm and have a projection 3a on one side. A black gold precipitate 4 was applied to the gold contacts in a nitrogen atmosphere of 1 torr. The black gold precipitate has a high absorption capacity for electromagnetic radiation. Circular portions with a diameter of approximately 6 mm were blanked or punched out of the so-layered substrate. The resulting discs had a recess 15 at the edge. At a position 2a opposite projection 3a of gold contact 3, the sodium nitrite film was briefly heated over its melting point by an incandescent platinum wire. The liquid sodium nitrite film contracts and frees the tindioxide layer 2 which forms the lower electrical contact of the sodium nitrite layer.

The disc shown in FIG. 4c was inserted into a plastic ring 6 (FIG. 4b) with the gold precipitate 4 facing downwards. The plastic ring has a wedge shaped projection 16 and is metal plated in two positions, 7, 7a. Reference numerals 17, 17a denote the locations at which electrically conductive adhesive drops were applied. These make electrical contact to the electrodes 2 and 3 at locations 2a and 3a when the disc pictured in FIG. 4c is inserted into the ring. Thereafter, a ring shaped spacer 8 and a cover plate 9, each made of plastic, were inserted into plastic ring 6. The resulting unit including parts 1–9 was inserted in a commercially available transistor housing. A large bore in the bottom of the housing was provided with a gas tight seal consisting of an electrically semiconductive silicon disc 11 glued by means of adhesive 20. The transistor housing was closed by a cover 12 which has two insulated through-contacts 13, 14. The dimensions of the arrangement were such that contacts 13, 14 were electrically connected to the metallized layer 7 of the plastic ring 6 via adhesive drops 18 when the cover was inserted. Further, cover 12 has a projecting portion 19 which causes the parts within the housing to be pressed tightly together. The cover was then soldered to housing 10 in a gas tight fashion. Alternatively, it could be glued on with an electrically conductive glue.

The radiation passing through window 11 into the detector is absorbed by gold precipitate 4 and heats the sodium nitrite layer. This causes a change of the temperature dependent spontaneous polarization of the sodium nitrite (pyroeffect) and, therefore, a charge to appear at the electrodes. The latter serves as proof that radiation, and in particular high frequency modulated radiation or short radiation pulses, was sensed by the detector. The charge appearing at the electrodes is fed into a preamplifier, which may also be incorporated into the transistor housing. The amplified signal can be used to activate a meter or an audio or visual alarm in well-known fashion.

Figure 5:
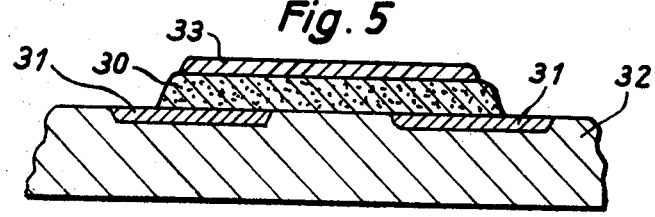
FIG. 5 shows a field effect transistor in accordance with the present invention.

Another embodiment of the present invention is the field effect transistor shown in FIG. 5. For this application, the ferroelectric sodium nitrite layer serves as the gate insulator in an MIS (metal-insulator-silicon) field effect arrangement.

The conventional silicon field effect transistor in MOS (metal oxide-silicon) form is so-constructed that silicon is covered with electrically insulating $SiO_2$. Metal is vapor deposited on the $SiO_2$ layer, the metal forming the gate contact. When a voltage is applied between the silicon and the gate contact which constitute the plates of a capacitor, a charge is created in the silicon in correspondence to the capacitance of the so-formed capacitor. The charge in turn changes the charge carrier concentration in a narrow zone at the junction to the $SiO_2$ layer, thereby changing the conductivity. This change in conductivity changes the amplitude of the current flowing between two electrodes, spaced laterally apart on the silicon and extending underneath the metallized oxide layer, (source and drain contacts) for a constant applied voltage.

In FIG. 5 reference numeral 30 denotes the sodium nitrite layer used as gate insulator. In this arrangement, the sodium nitrite layer 30 replaces the function of the $SiO_2$ layer in the MOS transistors. Correspondingly, the preparation of the source and drain electrodes 31 is the same as in the MOS transistor. If as few changes as possible are to be made in the manufacturing process relative to the MOS transistors, the oxidation of silicon to $SiO_2$ can take place in the region of the gate electrode prior to the application of the sodium nitrite layer. Thereafter, a metal layer is vapor deposited through a mask onto the sodium nitrite layer 30 just as was the case with the $SiO_2$. The metal layer then forms gate electrode 33. The source and drain electrodes which are still covered by $NaNO_2$, are freed by locally heating the $NaNO_2$ layer above the melting point at the corresponding places. The fluid film then contracts so that the electrodes are available for contacting by wires. The local heating over the melting point is accomplished by a $CO_2$ laser whose rays are applied through a mask so that only the source and drain electrodes are affected. The layering with $NaNO_2$ was effected by dipping a silicon structure 32 with source and drain electrodes 31 into a melt of $NaNO_2$ and then withdrawing the structure with a constant speed of 1 mm/sec. The temperature at the top surface of the melt was maintained approximately 5 degrees centigrade above the melting temperature of $NaNO_2$.

In contrast to insulators in the usual MIS arrangement, sodium nitrite is spontaneously polarized and thus creates additional charge carriers in the semiconductor substrate even without an applied gate voltage. The resistance of the semiconductor substrate is thus changed. Changes in spontaneous polarization brought about by voltage pulses at the gate electrode, or pressure or temperature changes, change the electrical resistance of the semiconductor substrate between the source and the drain electrode. Relative to the ferroelectric radiation detector described previously, in which the change in charge was detected by a voltage created across a high impedance, the field effect arrangement has the advantage of operating with a low impedance.

In the thin ferroelectric $NaNO_2$ layer of the arrangement shown in FIG. 5, two stable polarization directions exist. The polarization vector can either point to the semiconductor substrate 32, whereby additional electrons are induced therein, or can be pointed away from the semiconductor substrate 32, creating additional holes. The two stable oppositely directed polarization directions in $NaNO_2$ therefore cause two different resistances to exist between source and drain electrodes 31.

This effect can be utilized for data storage. A short pulse of voltage applied between gate electrode 33 on the one hand and source or drain electrode 31 on the other hand causes one of the two possible polarization directions to exist beneath the gate electrode. This polarization direction remains stable without further applied voltage.

A disadvantage of all previously known ferroelectric field effect transistor arrangements is the lack of longtime stability in the semiconductor resistance changes caused by the spontaneous polarization of the ferroelectric material. The reason for this is a very high density of boundary surface states. Thus a read-out of the information stored in the form of the direction of the spontaneous polarization cannot be effected by means of the source-drain resistance after a relatively short time.

This difficulty is removed by a new read-out method. Specifically, the fact is utilized that the spontaneous polarization changes with temperature. For a rapid change in temperature (as fast or faster than changes in occupation of the boundary states) changes in source-drain resistance are created. For increases in temperature a decrease in the electron concentration results, when the polarization vector points to the semiconductor, while increases in electron concentration occur if the polarization vector points away from the semiconductor. The required rapid temperature change in the semiconductor is achieved, for example, by application of a short time source-drain current of high amplitude or by external heating by absorption of radiation.

Since the absorption of radiation in a field effect arrangement as shown in FIG. 5 causes a change in the temperature dependent spontaneous polarization of the ferroelectric material $NaNO_2$, the resultant change in source drain resistance in the semiconductor can be utilized to detect the presence of radiation.

Another storage device of the present invention consists of a sodium nitrite layer of a few $\mu$m thickness between two continuous electrodes. Storage elements of the layer are defined by the positions which a deflectable laser beam can address. The direction of the polarization representing the information stored in a particular storage element is read out by heating this spot in the sodium nitrite layer by a pulse of the laser beam, and recording the pyroelectric signal between the two continuous electrodes.

Information is recorded by simultaneously applying a voltage of proper sign to the two continuous electrodes and addressing the proper storage element by a laser pulse which heats it close to the Curie temperature. During the irradiation by the laser pulse and the application of the voltage, the spontaneous polarization in the storage element aligns parallel to the applied electric field.

This recording method makes use of another advantageous property of the sodium nitrite layers, namely, that at temperatures up to about 100° C. the spontaneous polarization is insensitive to electric fields, so that the polarization in other storage elements, not being addressed by the laser, will not be affected. To facilitate heating of an addressed storage element by the laser pulse, the sodium nitrite layer is kept well above room temperature.

Another radiation detector of the present invention (FIGS. 6,7) consists of a sodium nitrite layer 60 with an array of electrodes 61. If electrodes 61,62 as shown, are applied to both sides of the sodium nitrite layer 60, only the electrodes 61 on one side of the layer 60 need be in the form of an array. On the other side, a continuous electrode 62 suffices. The sodium nitrite layer 60 may either form a coherent layer (FIG. 6) or be divided into maximally as many sections as the array contains separate electrodes (FIG. 7). Reference numeral 63 denotes the substrate material.

Figure 6:
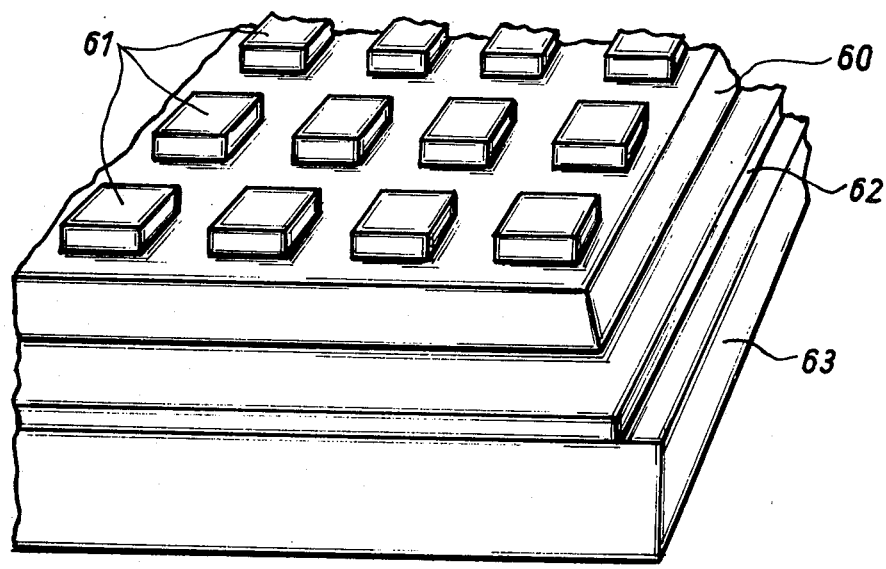
FIG. 6 shows a sensing element of the present invention having an electrode array.
Figure 7:
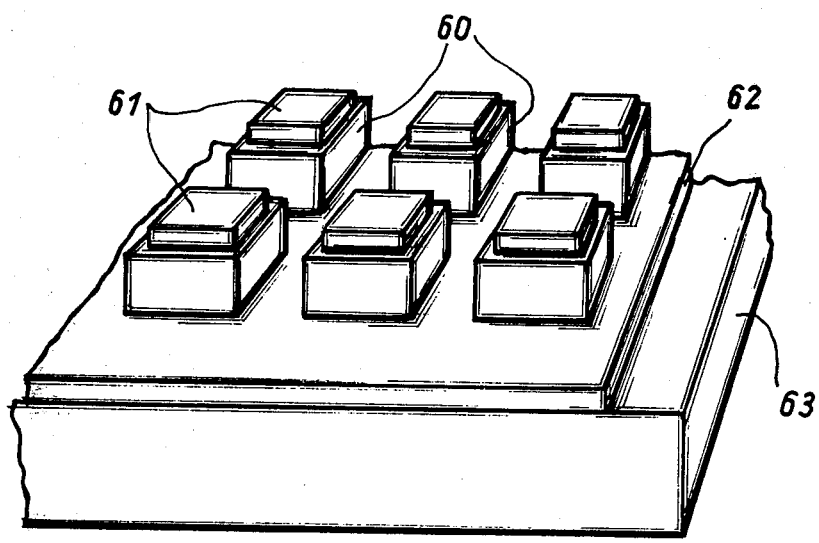
FIG. 7 shows an alternate form of the embodiment of FIG. 6.

Arrays as shown in FIGS. 6,7 can also be used to convert an optical image of an object into electrical signals. If the image is focused on the plane of the array, the charge on each electrode of the array is a measure of the amount of radiation that the image contains at the locus of that particular electrode.

Figure 8:
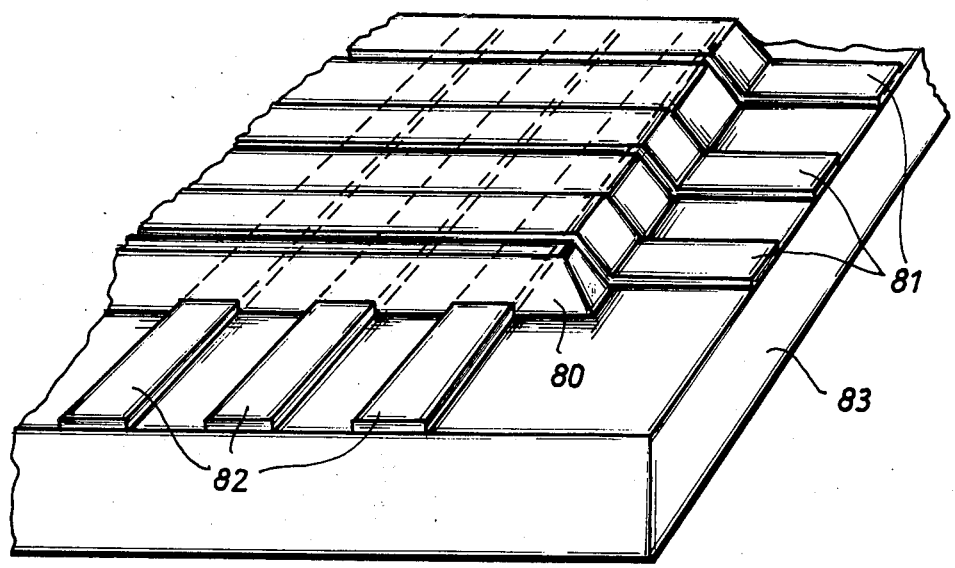
FIG. 8 shows a sensing element according to the present invention, having two arrays of parallel stripe electrodes.

For another embodiment, which is shown in FIG. 8, the upper and lower surfaces of a sodium nitrite layer 80 are covered with an array of parallel stripe electrodes, the stripes 81 on one surface forming an angle (preferably 90°) with the stripes 82 on the opposite surface. By recording the voltage or current between one of the stripes on the upper surface and one of the stripes on the lower surface, radiation incident on the sensor element at the intersection of the two stripes is detected. Reference numeral 83 denotes a substrate. The field effect transistor embodiment of the radiation detector described above may also be provided with an array of source and drain electrodes, which are all arranged in the same plane on the substrate. The sodium nitrite layer may either cover the array of source and drain electrodes coherently, or be divided into sections, each covering a pair of source-drain electrodes. On top of the sodium nitrite layer either a single coherent conductive gate electrode is deposited, or several gate electrodes are deposited permitting separate electrical connections to each gate electrode.

In another embodiment of the invention, the substrate with its sodium nitrite layer is electrically addressed by an electron beam in an evacuated tube. For this purpose, the sodium nitrite is applied to an electrically conductive substrate or a substrate with an electrically conductive layer. No second electrode or electrode array is applied to the sodium nitrite layer as was for the detector described above. An image of an object is formed on the sodium nitrite layer in the evacuated tube by an optical system, causing localized heating in correspondence to the incident rays. The changes in charge on the sodium nitrite layer caused by the incident rays are then scanned with the electron beam. The required beam controls and read-outs are well known from television systems and therefore require no further discussion here.

Figure 9:
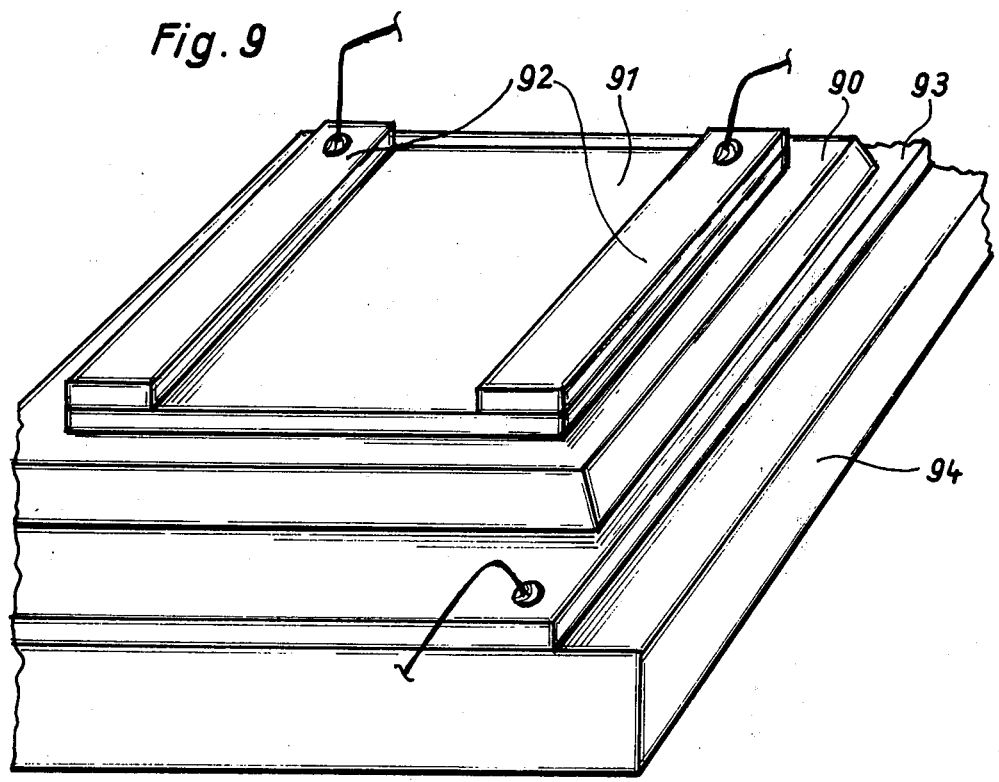
FIG. 9 shows a calibration arrangement on a radiation detector according to the invention.

Any of the radiation detectors according to the present invention may be equipped in a way that allows calibration of the amount of incident radiation energy by comparing it with a readily measurable amount of electrical energy (FIG. 9). For this purpose a sodium nitrite layer 90 is covered with a resistive layer 91 which is heated electrically when an electric current passes through it. This current is generated by a voltage applied across the resistive layer via electrodes 92. Current and voltage, which can readily be measured, determine the rate at which energy is transferred to the detector. Calibration is achieved by recording the pyroelectric signal caused by a known amount of electrical energy and measured between the resistive layer 91 and the lower electrode 93. Reference numeral 94 denotes the substrate material.

Any of the radiation detectors encompassed by the present invention may contain an additional radiation absorption layer to maximize the absorbed fraction of the incident radiation. An example is given by the radiation detector shown in FIG. 4a, in which the black gold precipitate 4 represents the absorption layer.

The sodium nitrite layer of the radiation detector of the present invention is slightly hygroscopic and should, therefore, be protected against moisture or moist air. It should therefore be encapsulated in an air-tight housing and, in addition, the housing may contain some moisture-absorbing chemical agents. The housing, if not transparent in itself, must of course contain a window which is transparent to the particular spectral region of the radiation to be detected.

While the invention has been illustrated in preferred embodiments, it is not to be limited to the circuits and structures shown, since many variations thereof will be evident to one skilled in the art and are intended to be encompassed in the present invention as set forth in the following claims.

We claim:

1. Improved ferroelectric or pyroelectric sensing element comprising
    a substrate;
    a crystalline sodium nitrite layer deposited on said substrate; and
    at least one electrode in contact with said crystalline sodium nitrite layer.

2. A sensing element as set forth in claim 1, wherein said substrate is a semiconductor substrate having an upper surface;
    wherein said at least one electrode comprises a first and second output electrode deposited on said upper surface;
    wherein said layer of sodium nitrite has a lower surface covering at least a part of each of said output electrodes; and
    further comprising a metallic layer deposited on said layer of sodium nitrite.

3. A sensing element as set forth in claim 1, wherein said crystalline sodium nitrite layer has a top and bottom surface; and
    wherein said at least one electrode comprises an array of electrodes deposited on at least one of said surfaces.

4. A sensing element as set forth in claim 3, wherein said at least one of said surfaces is the upper surface.

5. A sensing element as set forth in claim 1, wherein said substrate has a plurality of crystalline sodium nitrite layers deposited side by side thereon;
    wherein each of said plurality of crystalline sodium nitrite layers has at least one electrode positioned on the top surface thereof; and
    further comprising a second electrode interposed between said substrate and said plurality of crystalline sodium nitrite layers.

6. A sensing element as set forth in claim 1, further comprising a radiation absorption layer deposited on said sodium nitrite layer.

7. A sensing element as set forth in claim 1, further comprising a radiation absorption layer deposited on said at least one electrode.

8. A sensing element as set forth in claim 2, wherein said sensing element constitutes a field effect transistor, said output electrodes constituting source and drain electrodes;

wherein changes in temperature cause changes in spontaneous polarization of said sodium nitrite layer, thereby changing the resistance between said source and drain electrodes; and wherein said changes in temperature are created by changes due to the presence of radiation.

9. A sensing element as set forth in claim 1, wherein said crystalline sodium nitrite layer has a thickness in the order of several microns.

10. A sensing element as set forth in claim 1, wherein said crystalline sodium nitrite layer has a thickness in the order of about 1 to 25 microns.

11. A sensing element as set forth in claim 1, wherein said sodium nitrite layer has a thickness in the range of 1 to 10 microns.

12. A sensing element as set forth in claim 1, wherein said at least one electrode is interposed between said crystalline sodium nitrite layer and said substrate;

further comprising a resistive layer covering said crystalline sodium nitrite layer, and a first and second calibrating electrode on said resistive layer, whereby said sensing element is calibrated by measurement of the signal generated between said resistive layer and said at least one electrode in response to a known amount of electrical energy applied to said resistive layer through said first and second calibrating electrodes.

13. A sensing element as set forth in claim 1, wherein said crystalline sodium nitrite layer has a top surface and a bottom surface;

wherein said at least one electrode comprises a first array of stripe electrodes arranged substantially parallel to each other in contact with said top surface and a second array of stripe electrodes arranged substantially parallel to each other and at a predetermined angle to said first array in contact with said bottom surface, so that each of said stripe electrodes of said second array intersect at least one of said stripe electrodes of said first array, whereby measurement of an electrical signal between a selected one of said electrodes of said first array and an intersecting one of said electrodes of said second array is indicative of radiation incident at the location of said intersection.

14. A sensing element as set forth in claim 13 wherein said predetermined angle is an angle of 90°.

15. Apparatus for creating a signal at an output electrode in response to a change in energy received by said apparatus, comprising, in combination a substrate; a thin crystalline layer of sodium nitrite deposited on said substrate, said substrate with said layer of sodium nitrite constituting a sensing element subject to polarization changes in response to predetermined changes of energy applied thereto; and means for creating said signal at said output electrode in response to said polarization changes in said sensing elements.

16. Apparatus as set forth in claim 15 wherein said apparatus is a television camera tube having means for focusing the image of an object being photographed onto a predetermined image plane and having scanning means for scanning said image plane and creating a television signal corresponding to the charge distribution thereon; wherein said ferroelectric body is mounted in said image plane; and wherein said means for creating said signal at said output electrode comprises said scanning means of said television camera tube.

17. Radiation detector, comprising, in combination, a substrate; a crystalline sodium nitrite layer, having a first and second electrode respectively positioned on top and bottom surface thereof, deposited on said substrate; an air tight housing having a window transparent to a predetermined part of the electromagnetic radiation spectrum; mounting means for mounting said substrate with said sodium nitrite layer deposited thereon behind said window within said housing; and a third and fourth electrode in electrical contact, respectively, with said first and second electrode, and extending through said housing, whereby radiation within said predetermined part of said spectrum received through said window heats said sodium nitrite layer thereby changing its spontaneous polarization and creating a charge at said third and fourth electrode.

18. Apparatus as set forth in claim 17 further comprising a radiation absorption layer deposited on said first electrode and positioned relative to said window to receive said radiation, whereby radiation passing through said window is absorbed by said absorption layer thereby heating said sodium nitrite layer.

19. A sensing element as set forth in claim 1, wherein the ferroelectric domains of said sodium nitrite layer are pre-oriented by poling the layer in an electric field in the order of $10^3$–$10^5$ V/cm applied perpendicularly to the layer at a temperature in the range between 80° and 160° C.

* * * * *